US007030668B1

(12) United States Patent
Edwards

(10) Patent No.: US 7,030,668 B1
(45) Date of Patent: Apr. 18, 2006

(54) VOLTAGE DETECTOR

(75) Inventor: Eric E. Edwards, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/603,217

(22) Filed: Jun. 24, 2003

(51) Int. Cl.
*H03K 17/22* (2006.01)
*H03K 5/153* (2006.01)

(52) U.S. Cl. ...................................... 327/143; 327/198

(58) Field of Classification Search ................ 327/142, 327/143, 198, 205

See application file for complete search history.

(56) References Cited

U.S. PATENT DOCUMENTS 4,142,118 A * 2/1979 Guritz ......................... 327/72
4,309,627 A * 1/1982 Tabata ......................... 327/81
5,144,159 A * 9/1992 Frisch et al. ................ 327/198
5,523,709 A * 6/1996 Phillips et al. .............. 327/143
5,929,674 A * 7/1999 Maccarrone et al. ........ 327/143
6,121,813 A * 9/2000 Furuchi ...................... 327/285
6,147,521 A * 11/2000 Degoirat et al. .............. 327/81
6,229,352 B1 * 5/2001 Chevallier et al. ............ 327/77
6,259,285 B1 * 7/2001 Woods ....................... 327/143
6,285,222 B1 * 9/2001 Kitade ........................ 327/143
6,744,291 B1 * 6/2004 Payne et al. ................ 327/143
2004/0036514 A1 * 2/2004 Kwon ........................ 327/143
2005/0212572 A1 * 9/2005 Adams et al. ............. 327/143

* cited by examiner

*Primary Examiner*—Kenneth B. Wells
*Assistant Examiner*—Terry L. Englund
(74) *Attorney, Agent, or Firm*—Peter Hernandez; William L. Paradice

(57) ABSTRACT

A voltage detector circuit such as a power up and/or brown-out detector circuit (100) includes a comparator (102) having at least one of its inputs (104) coupled to a diode-connected transistor (108). The other input can include another diode-connected transistor (110) or a resistor divider (302). Optional compensation capacitors (118 and 120) can be added to the comparator output (116) to provide glitch compensation. Since comparator (102) only needs to output a high or low voltage level, the components that are used to build circuit (100) do not have to have very tight tolerances. Circuit (100) also can operate at very low voltages and consume low amounts of power.

11 Claims, 7 Drawing Sheets

VOLTAGE DETECTOR

FIELD OF THE INVENTION

This invention relates in general to the field of electronics and more specifically, to a voltage detector such as a low-power power up reset and/or trip voltage detector.

BACKGROUND OF THE INVENTION

Integrated circuits (ICs) such as Programmable Logic Devices (PLDs), including Field Programmable Gate Arrays (FPGAs), require some form of "power up reset" (PUR) detector. The PUR detector informs the IC when to start configuration and/or resetting of its registers. The PUR detector provides a signal to the IC informing it that the supply voltage to the IC has reached an acceptable level after the IC is powered up.

Typically, a band-gap regulated PUR is used to determine when the main power (supply voltage) of the IC is high enough to start configuration and/or resetting of the IC registers after a reset or power-up condition has occurred. Although useful, a band-gap regulated PUR circuit has several disadvantages, mainly it consumes a lot of power. It also needs to use precisely manufactured diodes and resistors since it requires tight component tolerances to function properly.

With the need in the electronics industry for lower power consumption and lower voltage ICs to support such areas as portable communication devices and portable computers, a need exists in the art for a power-up reset and/or brownout detector circuit that can operate at lower voltages and consume less power than some of the previous PUR circuits.

SUMMARY OF THE INVENTION

In accordance with one embodiment of the present invention, a voltage detector circuit such as a power-up reset detector circuit includes a comparator having first and second inputs and an output; at least one diode coupled to the first input and to a power supply voltage; at least one diode or at least one resistor divider coupled to the second input and to ground; and a reset signal generated at the output when the voltages at the first and second inputs are approximately the same. In addition, each diode may include a transistor in which the gate is tied to the drain, i.e., a diode-connected transistor.

The one or more diode-connected transistors coupled to the inputs of the comparator are connected such that one of them tries to maintain a first node voltage that is one or more "Vt" (transistor threshold voltage) above ground potential. The other input of the comparator is connected similarly with a diode-connected transistor or a resistive voltage divider that tries to maintain a second node voltage that is one or more Vt below the supply voltage. Once the first and second node voltages cross, the comparator switches its output providing a reset signal.

In accordance with another aspect of the present invention, a plurality of diode-connected transistors can be coupled to at least one or both inputs of the comparator. This type of circuit can be used not only as a power up detector, but as a reference voltage detector for use in different types of voltage monitoring applications.

BRIEF DESCRIPTION OF THE DRAWINGS

The features of the present invention, which are believed to be novel, are set forth with particularity in the appended claims. The invention, may best be understood by reference to the following description, taken in conjunction with the accompanying drawings, in the several figures of which like reference numerals identify like elements, and in which:

DETAILED DESCRIPTION OF THE PREFERRED EMBODIMENT

Figure 1:
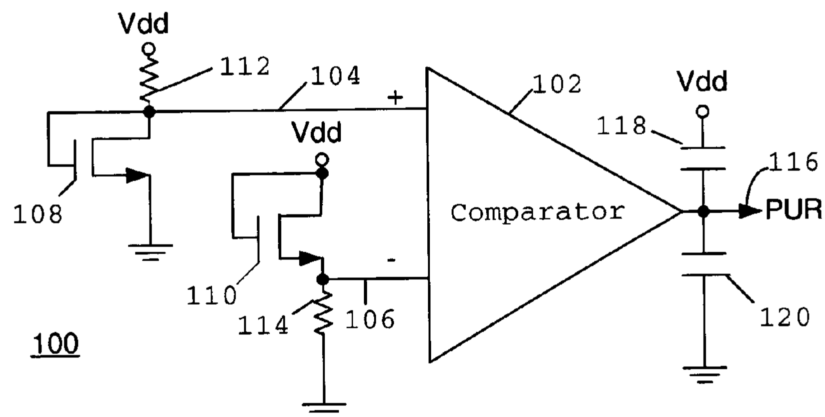
FIG. 1 shows a low power PUR circuit in accordance with an embodiment of the invention.

While the specification concludes with claims defining the features of the invention that are regarded as novel, it is believed that the invention is better understood from a consideration of the following description in conjunction with the drawing figures.

Referring to FIG. 1, there is shown a reset circuit 100 in accordance with one embodiment of the invention. Circuit 100 includes a comparator 102 having a first input 104 and a second input 106. Coupled to the first input 104 is a first diode-connected transistor 108 and coupled to the second input 106 is a second diode-connected transistor 110. A diode-connected transistor is one in which the gate is connected to the drain and is made to behave like a diode under certain circumstances. In an alternative embodiment, the diode-connected transistors 108 and 110 are replaced by diodes.

Both of the transistors 108 and 110 have current limiting resistors 112 and 114 coupled to them as shown. Comparator 102 includes a PUR output 116 for providing a power up reset signal to the IC. In a preferred embodiment, power up reset detector circuit 100 is connected as a "Two-Vt Detector" as will be explained below.

In circuit 100 as the supply voltage, Vdd, ramps up, transistors 108 and 110 turn on, and try to maintain a threshold voltage (Vt) drop across their drain and source nodes. Transistor 110 tries to maintain a voltage Vt below the supply voltage potential, and transistor 108 tries to maintain a Vt above ground potential.

Figure 2:
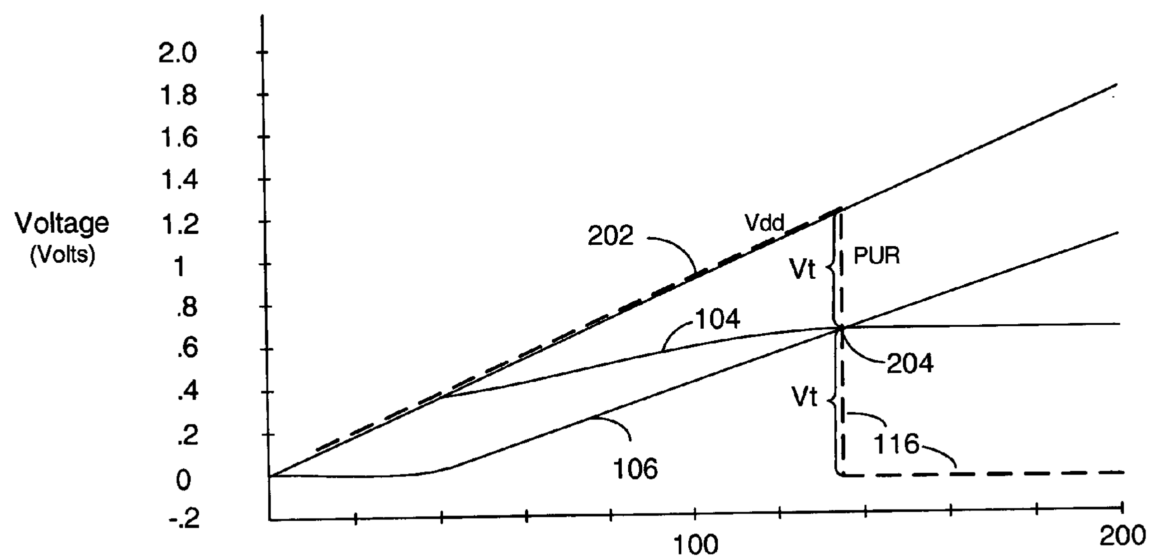
FIG. 2 shows a graph of voltage vs. time for the input nodes of the PUR circuit in FIG. 1.

In FIG. 2 there is shown a plot of voltage versus time for the circuit 100 also showing the voltage of the supply voltage Vdd 202. The voltage levels at inputs 104 and 106 of the comparator are shown as the power is ramped up from ground potential (e.g., zero volts). At the point 204 (cross over point) at which the voltages of inputs 104 and 106 intersect (i.e., where input 104 is approximately Vt below Vdd and input 106 is approximately Vt above ground potential), the reset signal at comparator output 116 goes from Vdd to ground potential (logic low, in this case zero volts). Although zero and Vdd have been used in this embodiment, different levels can be used in other designs depending on the required design criteria.

Since comparator 102 only needs to output a digital high or low signal at output 116, the components that are used to build circuit 100 do not have to have tight component tolerances. If the comparator output 116 has optional compensation capacitors 118 and 120 added from the output to both supply and ground potentials, then the circuit 100 responds slowly to any glitches found in the supply voltage (Vdd).

Once Vdd drops back below the crossover point 204, then the PUR signal at output 116 again transitions back from a low to a high voltage level. In this way, circuit 100 can also be used as a "brown-out" detector. A "brown-out" detector informs the IC, when dangerously low supply voltage levels conditions have been reached for a long enough period of time, and that the IC should reconfigure itself.

Figure 3:
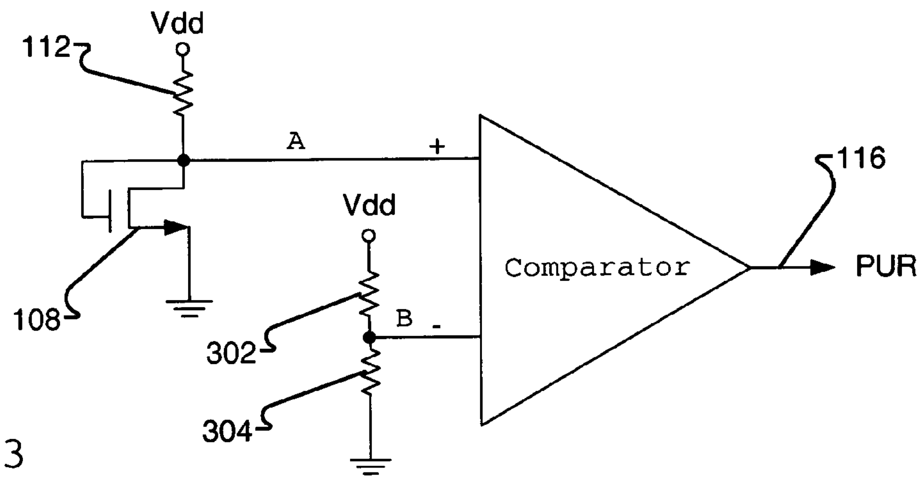
FIGS. 3–7 show other low power PUR circuits in accordance with other embodiments of the invention.

Another embodiment of the present invention includes using a resistor divider (resistors 302 and 304 connected in series) coupled to the B (negative) input of the comparator as shown in FIG. 3. The resistor 112 connected in series to diode connected transistor 108 is the same as in FIG. 1. In this way, a "one-Vt" detector up to a "many-Vt" detector, can be designed depending on the sizes of the resistors 302 and 304 chosen.

Figure 13:
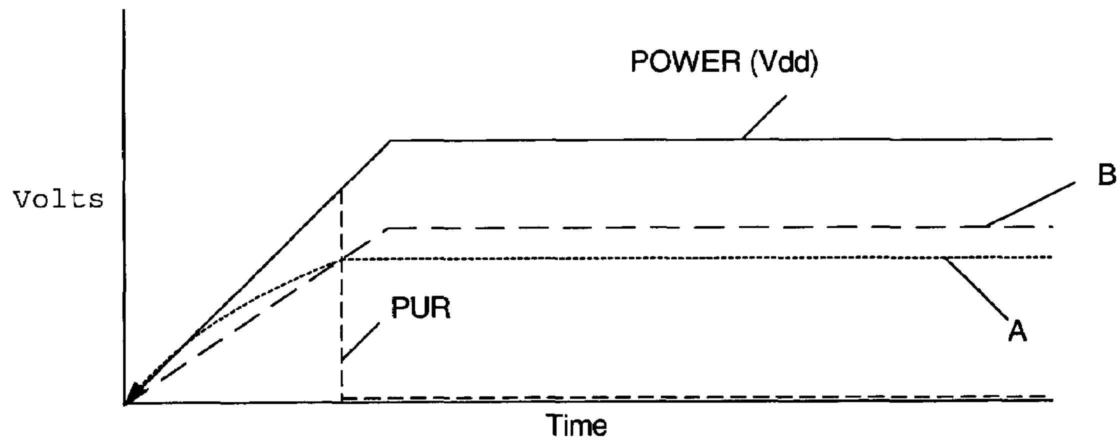
FIG. 13 shows the point at which the PUR signal switches for the circuit of FIG. 3 in accordance with an embodiment of the invention.

The circuit of FIG. 3 produces waveforms at the "A" node, "B" node and for the PUR signal in view of changes in the supply voltage Vdd as shown in FIG. 13. Node B in FIG. 3 is proportionally less than Vdd as shown by the waveforms Vdd and B in FIG. 13. Waveform A (node A in FIG. 3) rises as Vdd rises to Vt above ground. The crossover of A and B as shown in FIG. 13 can be varied by changing the resistor divider having resistors 302 and 304.

Figure 6:
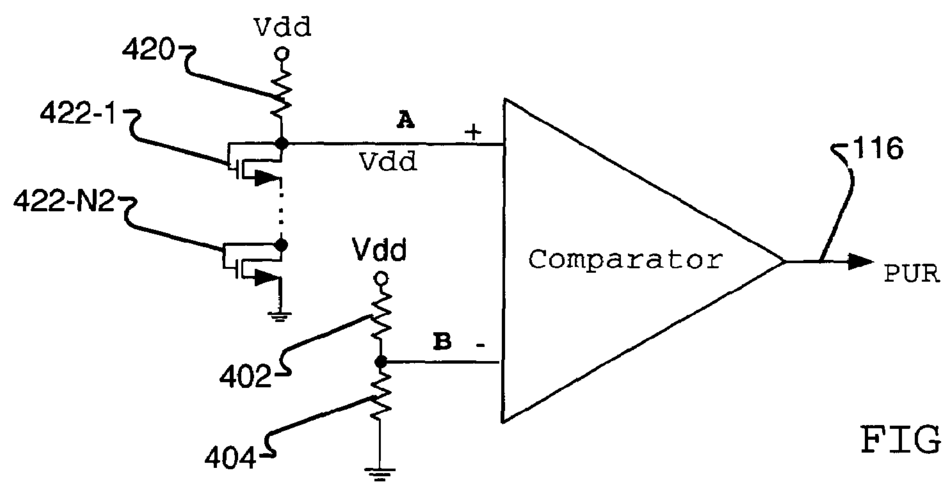

FIG. 6 is the many-Vt version of FIG. 3. Resistor 420 corresponds to resistor 112 and diodes 422-1 to 422-N2 replace diode 108. Hence, node A goes to (N2*Vt) above ground, where "N2" is a positive integer.

Figure 4:
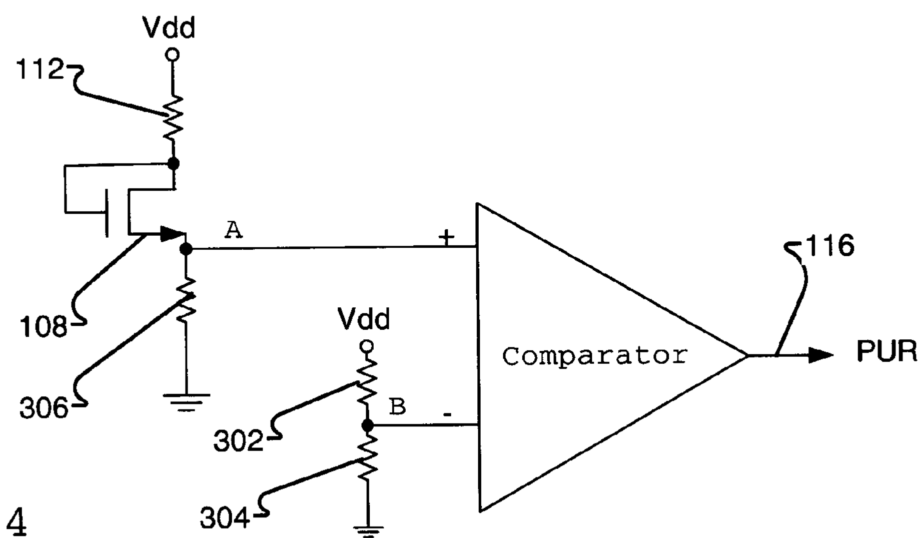
Figure 14:
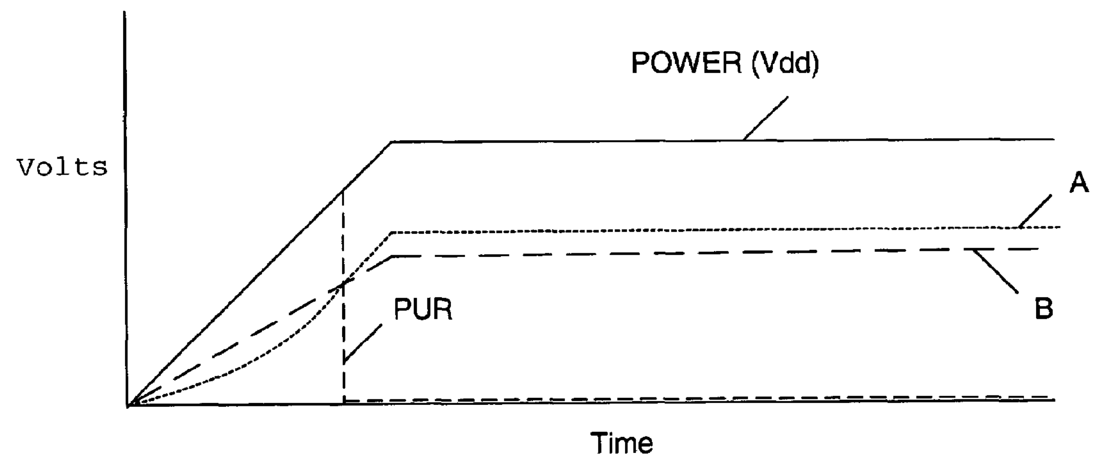
FIG. 14 shows the point at which the PUR signal switches for the circuit of FIG. 4 in accordance with an embodiment of the invention.

FIG. 4 shows another embodiment of a modification to the transistor placement at node A. Transistor 108 is connected to and is located in between resistors 112 and 306. Node A is connected to resistor 306 and transistor 108. Node B remains the same as FIG. 3. A waveform diagram for the circuit of FIG. 4 is shown in FIG. 14. As can be noted in FIG. 14, the change in placement of the transistor 108 as shown in FIG. 4 at node A, causes the waveform at node A to change as compared to that of the circuit in FIG. 3. Specifically, waveform A (node A) can now be adjusted to rise above waveform B (node B) in FIG. 14 by adjusting resistors 112 and 306. The circuits shown in FIGS. 3 and 4 show how a designer can make adjustments to the point at which the power up reset (PUR) signal changes from high to low.

Figure 7:
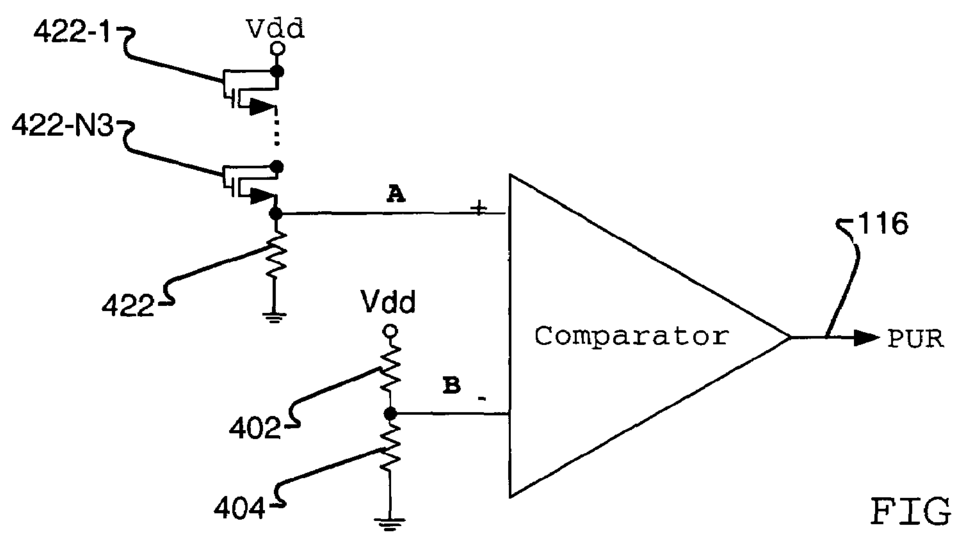

FIG. 7 is similar in function to FIG. 4. The node B resistors 402 and 404 correspond to resistors 302 and 304, respectively. Resistor 422 corresponds to resistor 306 of node A. In FIG. 7 the series connection of transistor connected diodes 422-1 to 422-N3, where N3 is an integer, replaces resistor 112 and transistor 108 in FIG. 4 in order to give a (N3*Vt) drop from Vdd on node A.

Figure 5:
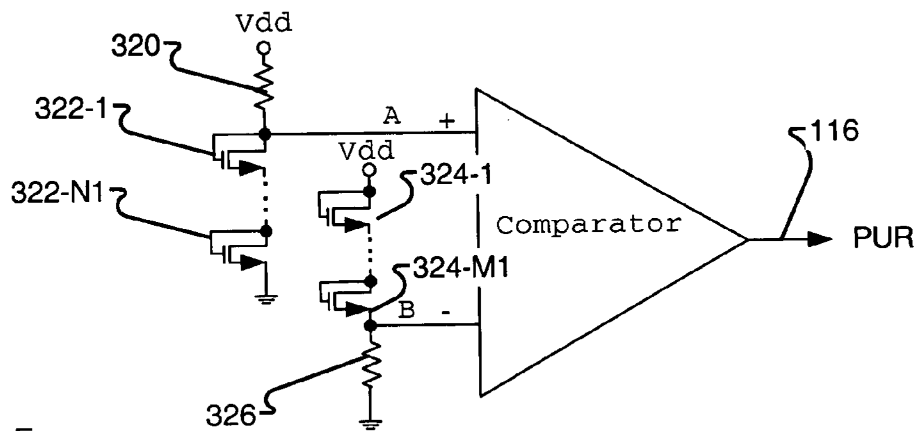

FIG. 5 has another aspect of the present invention showing the use of more than one series coupled diode-connected transistors on each input of the comparator, i.e., diode-connected transistors 322-1 to 322-N1 on node A and diode-connected transistors 324-1 to 324-M1 on node B, where N1 and M1 are positive numbers. The circuit of FIG. 5 with its several series connected transistors at both the A and B nodes, causes the voltages at these nodes to be greater than one Vt, and causes a shift at the point the PUR signal fires as compared to the design shown in FIG. 1.

Figure 8:
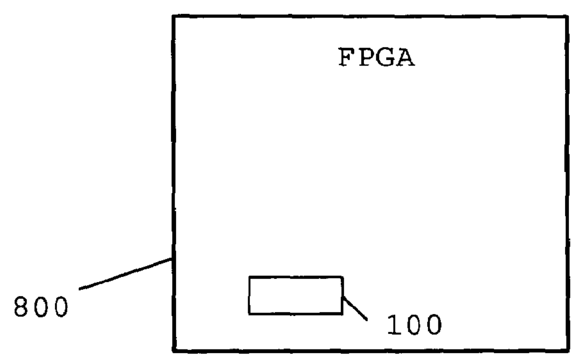
FIG. 8 shows an Integrated Circuit in accordance with an embodiment of the invention.

In FIG. 8, there is shown an IC 800 such as a Programmable Logic Device (PLD) like a FPGA that includes a PUR circuit 100. Although circuit 100 has been used as a power up reset and/or brown out detector in an embodiment of the present invention, the circuit 100 can also be used for other applications where a trip voltage detector is required.

Figure 9:
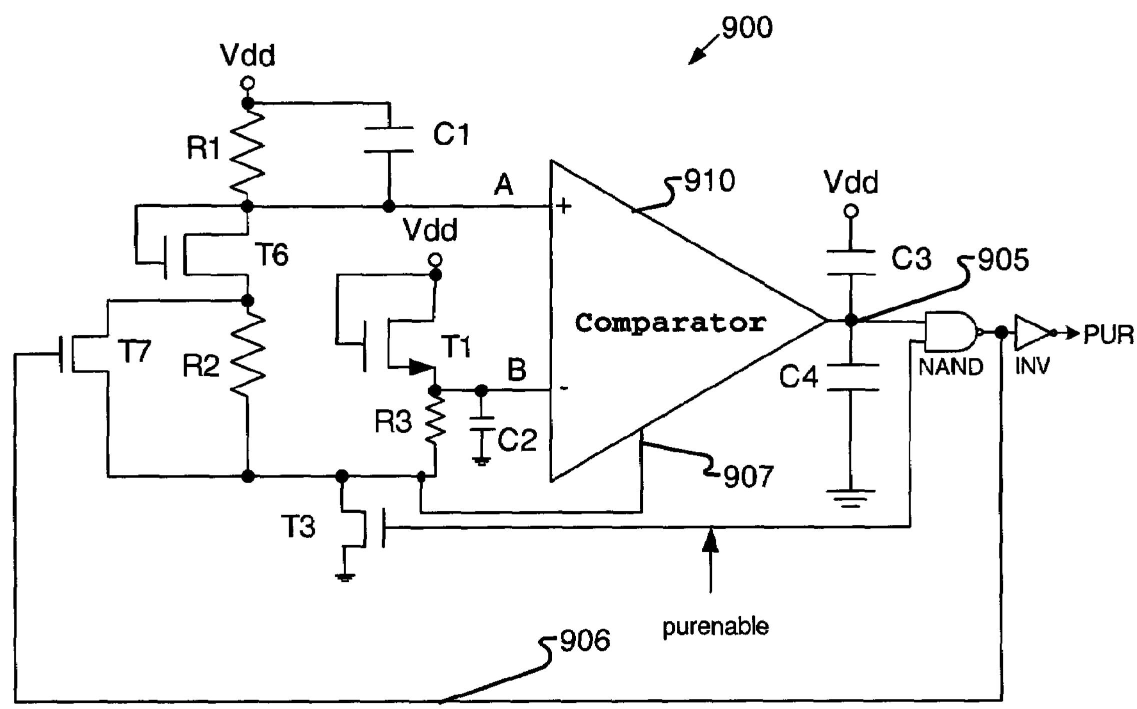
FIG. 9 shows a schematic of a voltage detector circuit in accordance with an embodiment of the invention.

In FIG. 9 there is shown a voltage detector circuit 900 that includes enable control and hysteresis circuits in accordance with an embodiment of the invention. The "purenable" signal shown in circuit 900 is used primarily for test purposes. If asserted to a logic high state, the purenable signal disables the circuit 900, and hence it uses little or no current. The purenable signal is useful when measuring the quiescent current of an IC that the circuit 900 is a part of, since the static current used by circuit 900 can be turned-off.

In FIG. 9 the comparator 910 has two input nodes A (+ input) and B (− input). Node A is coupled to diode connected transistor T6 and to resistor R1. R1 is connected in parallel to capacitor C1. Both R1 and C1 are connected to Vdd. Transistor T6 is connected to resistor R2. Node B is coupled to diode connected transistor T1 and to resistor R3. R3 is connected in parallel to capacitor C2. C2 is connected to ground and R3 is connected to transistor T3. The gate of T3 is connected to the purenable signal. The output 905 of comparator 910 is connected to capacitors C3 (which is also connected to Vdd) and C4 (which is also connected to ground). Output 905 is a first input to a NAND gate. The pureable signal, used for testing, is a second input into the NAND gate. The output of the NAND gate is input into an INV inverter and feedback 906 into the gate of T7. The output of the inverter INV is the power up reset (PUR) signal. The comparator 910 has also an enable signal line 907.

The capacitors C1 and C2 at the inputs and C3 and C4 at the output 905 of the comparator 910 help ensure that the output of the comparator 910 is biased correctly during extremely fast power-up conditions. The resistors R1 and R3 at the two input nodes A and B are of large value, e.g., about 1 megaohm (1 MΩ), in order to limit current. Also, with the capacitors C1 and C2, the A node is coupled to the supply voltage Vdd, so as to come up "high" during power up, and the B node is coupled to ground, so as to come up "low" during power up. This helps ensure that the comparator output 905 is biased correctly during fast ramping power-up conditions. The two capacitors C3 and C4 at the output of the comparator performs the same function in that the output node 905 is not be capacitively coupled to the supply voltage or ground during fast power-up conditions. The output node capacitors C3 and C4 gives the comparator 910 a chance to produce an output voltage 905 on its own rather than being coupled to either the supply voltage or ground.

The PUR output provided by comparator 910 comes up at a "high" logic level and transitions to a "low" logic level when the comparator 910 "fires" due to the input voltage at nodes A and B being substantially the same. In circuit 900 there is a hyteresis circuit, comprising transistor T7, the resistor R2, and the feedback 906, in which T7 is off when comparator 910 is at a high logic level. The point (e.g., point 204 in FIG. 2) at which the comparator transitions from a high to low logic level is held off by the resistor R2, e.g., about, 0.2 MΩ, because the voltage at node A is a little bit higher than if the resistor R2 was not used. Once the PUR signal transitions, the transistor T7 turns on and the source of transistor T6 is then connected to ground through T7. The voltage trip point at which the circuit 910 switches is therefore lower. The hysteresis circuit makes the power up reset circuit far less susceptible to noise found on the supply or ground lines.

Figure 11:
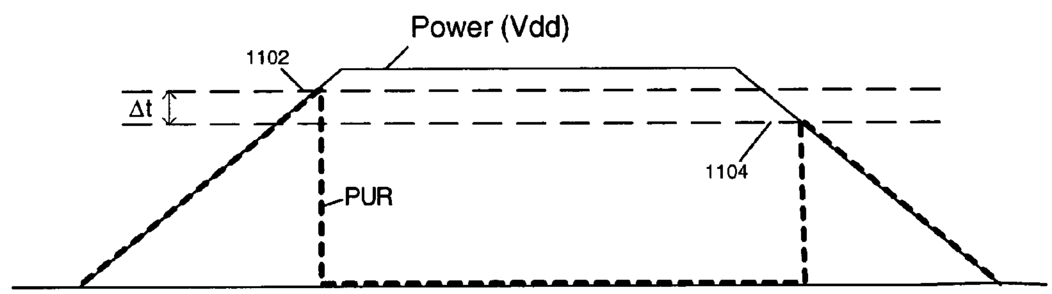
FIG. 11 shows a diagram highlighting the PUR and supply voltage signals in accordance with an embodiment of the invention.
Figure 12:
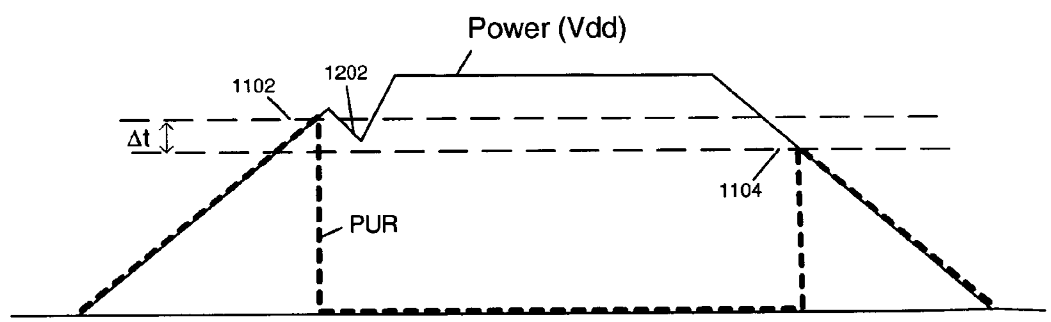
FIG. 12 shows the effect of a supply voltage glitch on the PUR signal in accordance with an embodiment of the invention.

As shown in FIG. 11, the transition point of circuit 900 is moved lower by about Δt from voltage level 1102 to voltage level 1104 when using the hysteresis circuit. In this embodiment the voltage difference between level 1102 and level 1104 is approximately Δt=0.15 volt. As shown in FIG. 11, the PUR signal does not transition from a low voltage level to a high level unless the supply voltage has dropped to level 1104 (approximately Δt from level 1102). In FIG. 12, there is shown a diagram that illustrates that by using the hysteresis circuit found in circuit 900, a power up condition that includes a voltage glitch 1202 less than approximately Δt does not cause the circuit PUR signal to switch.

Figure 10:
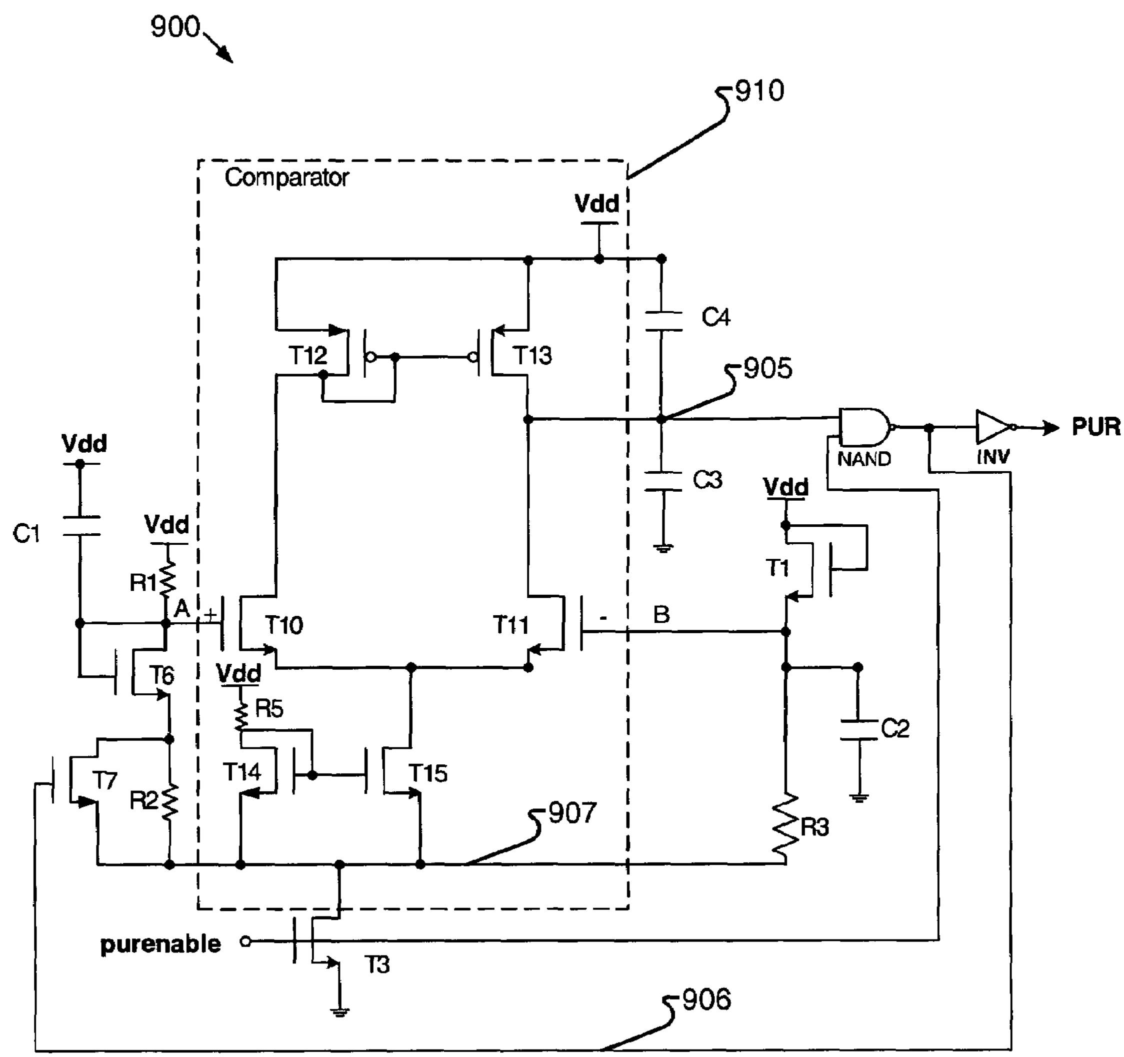
FIG. 10 shows a more detailed schematic of the voltage detector circuit shown in FIG. 9.

FIG. 10 shows a more detailed schematic of the voltage detector circuit shown in FIG. 9. Specifically, the comparator 910 in one aspect of the present invention is shown in more detail. The comparator 910 includes a differential amplifier circuit with transistors T12 and T13 connected together and coupled to transistors T10 and T11 respectively. T10 has input A (+) connected to T10's gate, and T11 has input B (−) connected to T11's gate. The transistors T14 and T15 and resistor R5 make up a current mirror that is connected to transistors T10 and T11 and is also connected to the enable signal line 907. The enable signal 907 is also connected to transistor T7, transistor T3, resistor R2, and resistor R3.

The PUR circuit 100 of an exemplary embodiment of the present invention provides for a trip voltage or reset circuit that consumes lower amounts of power and can operate at lower voltage levels as compared to conventional power up reset circuits. Circuit 100 may have a typical static current of approximately 5 micro-Amperes (μA). Circuit 100 also does not require the tight device tolerances of previous power up reset circuits nor a large amount of silicon real estate to implement (e.g., using 0.18 μm semiconductor technology, circuit 100 uses approximately 8,000 μm to implement). The circuit 100 relies on predicting transistor Vt's that are relatively well-controlled by the semiconductor foundry. Given these benefits of circuit 100, the range over which the circuit 100 transitions its digital output signal is relatively well-controlled. The low-voltage range over which circuit 100 switches is relatively small and may in this embodiment be in the order of 0.25 volt (V). Response times for circuit 100 are also good with maximum response times of less than 6 μs in typical implementations.

While the preferred embodiment of the invention have been illustrated and described, it will be clear that the invention is not so limited. Numerous modifications, changes, variations, substitutions and equivalents will occur to those skilled in the art without departing from the spirit and scope of the present invention as defined by the appended claims.

The invention claimed is:

1. A power up reset circuit, comprising:
- a comparator having first and second inputs and an output;
- a first diode connected transistor coupled between the first input and a power supply voltage;
- a first resistor coupled between the first input and ground potential;
- a second diode connected transistor coupled between the second input and a feedback transistor; a second resistor coupled in parallel with the feedback transistor, and
- a reset signal generated at the output when the voltages at the first and second inputs are approximately the same, wherein the reset signal is coupled to a gate of the feedback transistor.

2. The power up reset circuit of claim 1, wherein the first diode connected transistor coupled to the first input tries to maintain a one or more threshold voltage (Vt) difference from the power supply voltage at the first input.

3. The power up reset circuit of claim 1, wherein the first diode connected transistor tries to maintain a one or more threshold voltage (Vt) difference from the power supply voltage.

4. The power up reset circuit of claim 1, wherein the first and second resistors are coupled to ground via another transistor.

5. An integrated circuit having a power up reset circuit, comprising:
- a power supply directly connected to a first resistor, the first resistor in series with a first input node and a first diode connected transistor, the first diode connected transistor coupled to a first transistor;
- a second diode connected transistor directly connected to the power supply and connected in series with a second input node and a second resistor, wherein the second resistor is coupled to ground; and
- a comparator connected to the first input node and second input node and producing a reset signal when the voltages at the first and second input nodes are about equal, wherein the reset signal is at an output node between a first capacitor connected to the power supply and a second capacitor connected to ground; and
- wherein the reset signal is coupled to the first transistor.

6. The integrated circuit of claim 5, wherein the integrated circuit comprises a Field Programmable Gate Array (FPGA).

7. The integrated circuit of claim 5, wherein the comparator provides the reset signal as a two state output signal at the output node, a first or high logic level output state and a second or low logic level output state.

8. The integrated circuit of claim 5, wherein the first diode connected transistor is connected to a third resistor.

9. An integrated circuit having a power up reset circuit, comprising:

a power supply directly connected to a first resistor, the first resistor in series with a first input node and a first diode connected transistor, the first diode connected transistor connected to ground;

a second diode connected transistor directly connected to the power supply and connected in series with a second input node and a second resistor, wherein the second resistor is directly connected to ground; and a comparator connected to the first input node and second input node and producing a reset signal when the voltages at the first and second input nodes are about equal, further comprising a hysteresis circuit coupled to the comparator, the hysteresis circuit comprising a feedback transistor connected in parallel with a third resistor, wherein the gate of the feedback transistor is connected to the reset signal and wherein the third resistor is connected to the first diode connected transistor.

10. The integrated circuit of claim 9, wherein the integrated circuit comprises a Field Programmable Gate Array (FPGA).

11. The integrated circuit of claim 9, wherein the comparator provides the reset signal as a two state output signal at the output node, a first or high logic level output state and a second or low logic level output state.

* * * * *